US009589671B2

(12) United States Patent
Chen et al.

(10) Patent No.: US 9,589,671 B2
(45) Date of Patent: Mar. 7, 2017

(54) SELF TESTING DEVICE FOR MEMORY CHANNELS AND MEMORY CONTROL UNITS AND METHOD THEREOF

(71) Applicant: MStar Semiconductor, Inc., Hsinchu Hsien (TW)

(72) Inventors: Chung-Ching Chen, Zhubei (TW); Chen-Nan Lin, Zhubei (TW); Yi-Hao Lo, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 15/057,203

(22) Filed: Mar. 1, 2016

(65) Prior Publication Data
US 2016/0260500 A1    Sep. 8, 2016

(30) Foreign Application Priority Data

Mar. 3, 2015  (TW) .............................. 104106618 A

(51) Int. Cl.
| | |
|---|---|
| *G11C 7/00* | (2006.01) |
| *G11C 29/16* | (2006.01) |
| *G11C 29/52* | (2006.01) |
| *G11C 29/02* | (2006.01) |
| G06F 11/20 | (2006.01) |
| G06F 11/27 | (2006.01) |
| G11C 29/04 | (2006.01) |

(52) U.S. Cl.
CPC ............ *G11C 29/16* (2013.01); *G11C 29/025* (2013.01); *G11C 29/52* (2013.01); *G06F 11/2094* (2013.01); *G06F 11/27* (2013.01); *G11C 2029/0401* (2013.01)

(58) Field of Classification Search
CPC ........ G06F 11/2094; G06F 11/27; G11C 5/04; G11C 2029/0409; G11C 29/08; G11C 29/52

USPC ... 365/200, 201, 185.09; 714/718, 754, 768, 714/42

See application file for complete search history.

(56) References Cited

U.S. PATENT DOCUMENTS 7,657,803 B2 *  2/2010  Chae ...................... G11C 29/16
                                                   365/201
2015/0058685 A1   2/2015  Jang et al.

FOREIGN PATENT DOCUMENTS

TW         201433804 A      9/2014

OTHER PUBLICATIONS

TIPO Office Action, Jun. 24, 2016, 4 pages.

* cited by examiner

*Primary Examiner* — David Lam
(74) *Attorney, Agent, or Firm* — Edell, Shapiro & Finnan, LLC

(57) ABSTRACT

A memory self-testing device for testing a plurality of memory control units includes: a test control unit, coupled to the memory control units, generating a plurality of access request signals and a plurality of sets of data; a channel control unit, coupled to the test control unit and the memory control units, determining a leading feedback signal among a plurality of feedback signals; and a data control unit, coupled to the test control unit and the memory control units, storing the sets of data, and transmitting the sets of data to the memory control units according to a plurality of read/write signals. The feedback signals and the read/write signals are generated by the memory control units in response to the access request signals. The test control units generate the sets of data according to the leading feedback signal.

19 Claims, 11 Drawing Sheets

SELF TESTING DEVICE FOR MEMORY CHANNELS AND MEMORY CONTROL UNITS AND METHOD THEREOF

This application claims the benefit of Taiwan application Serial No. 104106618, filed Mar. 3, 2015, the subject matter of which is incorporated herein by reference.

BACKGROUND OF THE INVENTION

Field of the Invention

The invention relates in general to a memory self-testing device and method, and more particularly to a memory self-testing device and method for testing whether channels and memory control units of a memory are functional.

Description of the Related Art

FIG. 1 shows a block diagram of a conventional circuit system including a memory self-testing device. For example, the circuit system 100 is a partial circuit of a digital television system, and includes a memory self-testing device 110, a plurality of client ends 120, a bus 130, a plurality of channels 140, a plurality of memory control units (e.g., memory interface units, MIUs) 150, and a plurality of memory components 160. Each client end 120 is a function module of the television system 100, e.g., a Universal Serial Bus (USB) control unit, and accesses the memory components in an operation period. Each client end 120 may select one of the channels 140 via the bus 130 to access that memory component 160 with the memory control unit 150. To ensure that each client end 120 is capable of smoothly accessing the memory component 160 to complete its function, after the circuit system 100 is activated and starts normal operations, the channels 140 and the memory control units 150 are individually tested by the memory self-testing device 110. During the test, one channel 140 and the corresponding memory control unit 150 are first selected, and predetermined data is generated and written into the memory component 160 via the selected channel 140 and memory control unit 150. Data in the memory component 160 is read and compared with the written data to determine if the two sets of data are the same. If so, it means that the selected channel 140 and channel control unit 150 are normal, or else they are abnormal. As such, the test for one channel 140 and one memory control unit 150 is complete. If the circuit system 100 includes N channels 140 and N memory control units 150, the above steps need to be performed for N times to complete the test for all the channels and memory control units. Such time-consuming process results in an excessively long activation time.

FIG. 2 shows a block diagram of a conventional circuit system including a plurality of memory self-testing devices. FIG. 2 is an improvement of the circuit system 100 in FIG. 1. To reduce the activation time, the circuit system 200 includes multiple memory self-testing devices 110, which may simultaneously test multiple channels 140 and multiple control units 150. Thus, the activation time of the circuit system 200 is noticeably reduced, with however circuit costs being significantly increased as a trade-off.

SUMMARY OF THE INVENTION

The invention is directed to a memory self-testing device and a memory self-testing method. The device and method of the present invention simultaneously test a plurality of memory control units using one single testing device to reduce the test time.

The present invention discloses a memory self-testing device for testing a plurality of memory control units. The memory self-testing device includes: a test control unit, coupled to the memory control units, generating a plurality of access request signals and a plurality of sets of data; a channel control unit, coupled to the test control unit and the memory control units, determining a leading feedback signal among a plurality of feedback signals, the feedback signals being generated by the memory control units in response to the access request signals; and a data control unit, coupled to the test control unit and the memory control units, storing the data, and transmitting the data to the memory control units according to a plurality of read/write signals, the read/write signals being generated by the memory control units in response the access request signals. The test control unit generates the data according to the leading feedback signal.

The present invention further discloses a memory self-testing method for testing a plurality of memory control units. The memory self-testing method includes: generating a plurality of access request signals and a plurality of sets of data; determining a leading feedback signal among a plurality of feedback signals, the feedback signals being generated by the memory control units in response to the access request signals; generating a plurality of sets of data according to the leading data, and temporarily storing the data; and transmitting the data to the memory control units according to a plurality of read/write signals, the read/write signals being generated by the memory control units in response to the access request signals.

The present invention further discloses a circuit system. The circuit system includes: a plurality of memory control units, controlling a plurality of memory components; a function module, coupled to the memory control units, accessing the memory components via the memory control units; and a memory self-testing device, coupled to the memory control units, simultaneously testing the memory control units.

The memory self-testing device and memory self-testing method of the present invention simultaneously test a plurality of memory control units using one single testing device to reduce the test time. Compared to conventional solutions, the present invention is capable of simultaneously testing a plurality of memory control units and needs only one testing device. Thus, the test process of a memory can be accelerated without noticeably increasing circuit costs.

The above and other aspects of the invention will become better understood with regard to the following detailed description of the preferred but non-limiting embodiments. The following description is made with reference to the accompanying drawings.

DETAILED DESCRIPTION OF THE INVENTION

Technical terms of the application are based on the general definition in the technical field of the application. If the application describes or explains one or some terms, definitions of the terms are based on the description or explanation of the application.

The disclosure of the present invention includes a memory self-testing device and method capable of simultaneously testing a plurality of memory control units. In possible implementation, one person skilled in the art can choose equivalent elements or steps to achieve the present invention according to the disclosure of the application. That is, the implementation of the present invention is not limited to the embodiments below.

Figure 1:
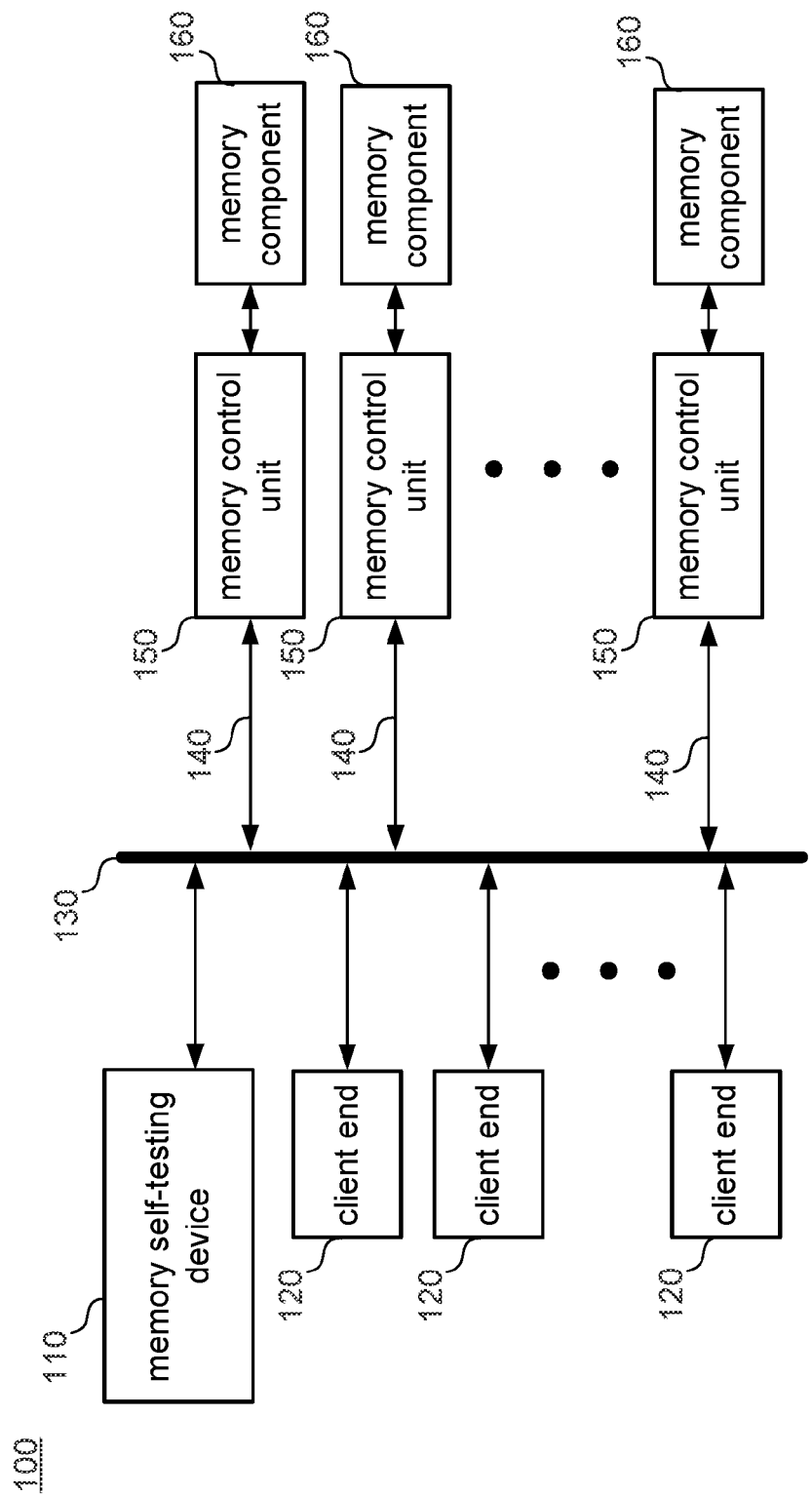
FIG. 1 is a block diagram of a conventional circuit system including a memory self-testing device.
Figure 2:
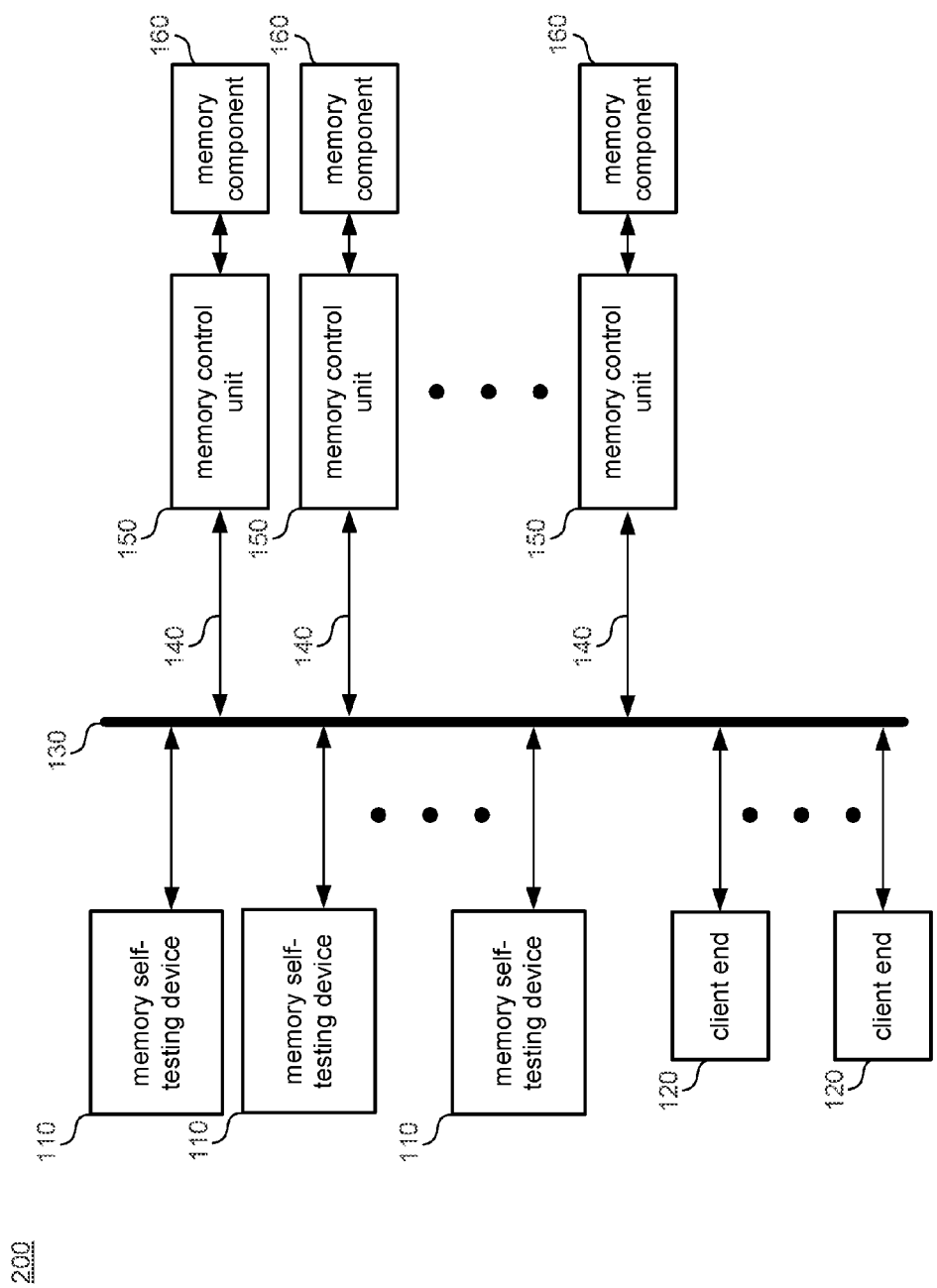
FIG. 2 is a block diagram of a conventional circuit system including a plurality of memory self-testing devices.
Figure 3:
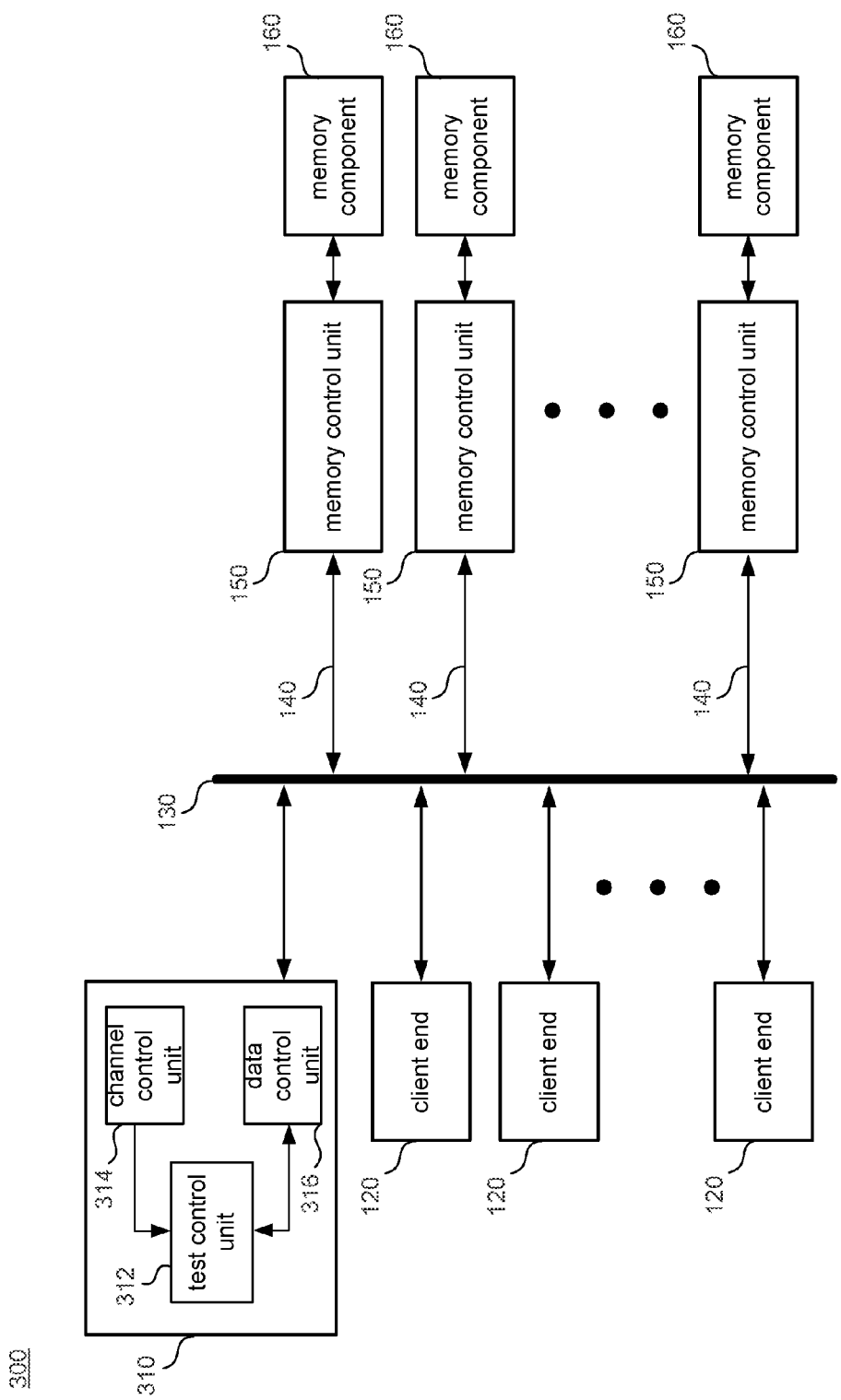
FIG. 3 is a block diagram of a circuit system including a multi-channel memory self-testing device according to an embodiment of the present invention.

FIG. 3 shows a block diagram of a circuit system including a multi-channel memory self-testing device according to an embodiment of the present invention. A circuit system 300 tests channels 140 and memory control units 150 by a multi-channel memory self-testing device 310. Clocks and phases of the memory control units 150 are different. Thus, when the multi-channel memory self-testing device 310 simultaneously issues access request signals to multiple memory control units 150, feedback signals received from the memory control units 150 may differ in time or phase. Using such characteristic, the multi-channel memory self-testing device 310 may test the multiple channels 140 and the multiple memory control units 150.

The multi-channel memory self-testing device 310 includes a test control unit 312, a channel control unit 314 and a data control unit 316. At the beginning of the test, the multi-channel memory self-testing device 310 is in a data writing state. The test control unit 312 first issues a write request signal to each of the memory control units 150, which then generates a feedback signal in response to the write request signal. Based on the reason above, the feedback signals have different temporal orders, and the delay in the feedback signals may get more obvious after several rounds of write requests. To prevent misjudging a feedback signal that is from a previous round and arrives later as an earliest feedback signal that is generated in response to a current round of write request, the multi-channel memory self-testing device 310 needs to identify a correct leading feedback signal from a plurality of feedback signals by using the channel control unit 314, and to transmit the leading feedback signal to the test control unit 312. After receiving the leading feedback signal, the test control unit 312 starts generating write data and transmits the write data to the data control unit 316. The memory control units 150 then send respectively write signals, and the data control unit 316 records respective data writing states of the memory control units 150 and provides appropriate write data according to the respective write signals of the memory control units 150. For example, the latest write data is provided for a write signal corresponding to the latest write request, and older write data is provided for a write signal that arrives later. Further, to save the storage space, the data control unit 316 adaptively clears outdated data according to reading/writing states of the memory control units 150.

After the data is written, the multi-channel memory self-testing device 310 enters a data reading state. A process, similar to issuing write request signals, starts issuing read request signals to the plurality of memory control units 150. In response to the read request signals, the memory control units 150 transmit feedback signals. After the channel control unit 314 determines the temporal orders of the feedback signals, the test control unit 312 starts generating verification data to the data control unit 316. The verification data and the write data are the same, or may have a predetermined relationship for subsequent comparison. The memory control units 150 then send read signals and read data. At this point, the data control unit 316 records respective data reading states of the memory control units 150 and outputs appropriate verification data according to the read signals of the memory control units 150. The test control unit 312 later compares each set of the verification data with the read data. If a comparison result indicates that all data of one memory control unit 150 is correct, it means that the memory control unit 150 and the corresponding channel 140 are functional. Conversely, it is determined that the memory control unit 150 and/or the corresponding channel 140 are/is abnormal, and shall not be utilized.

Figure 4:
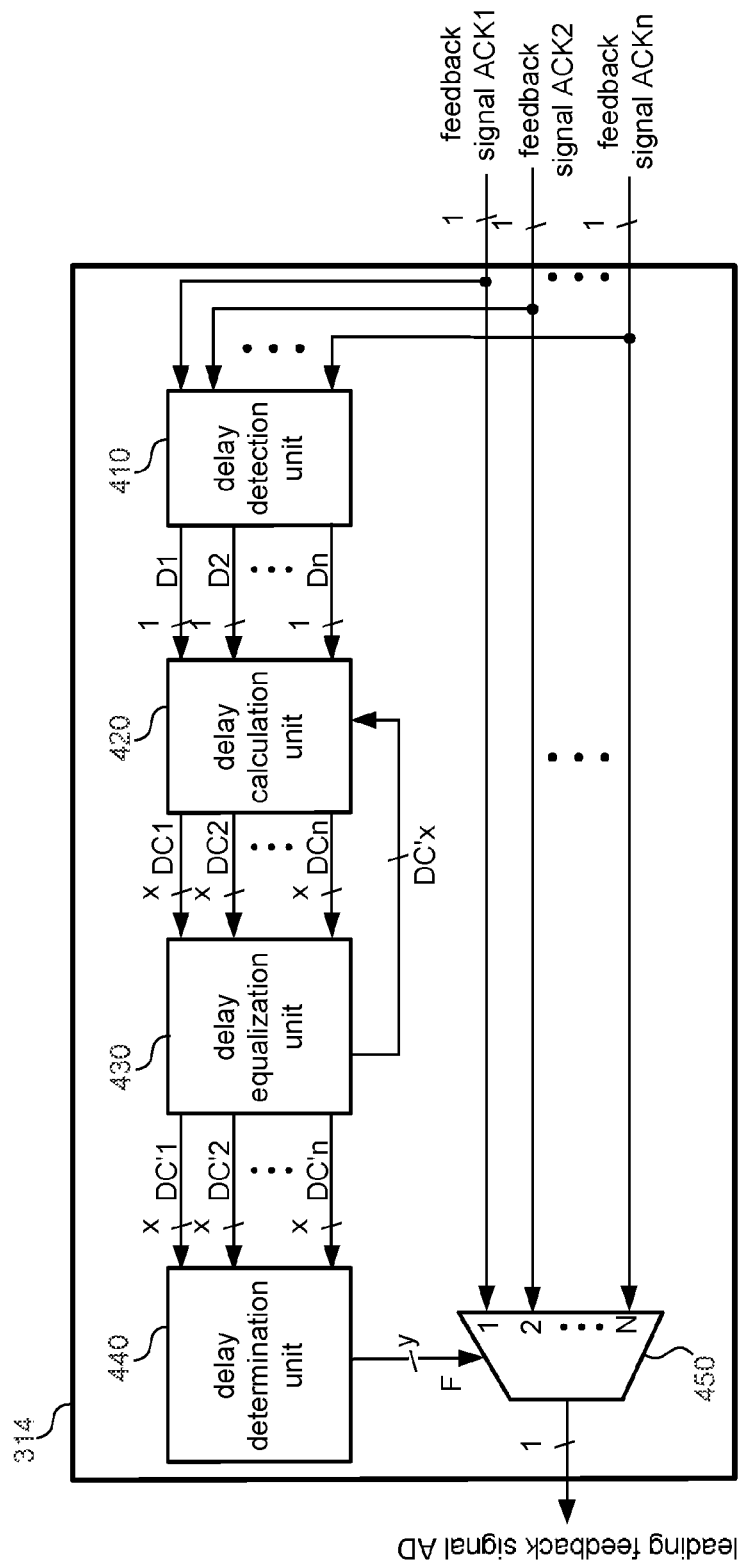
FIG. 4 is a block diagram of a channel control unit 314 according to an embodiment of the present invention.

Details of the circuits in the units of the multi-channel memory self-testing device 310 are given below. FIG. 4 shows a block diagram of the channel control unit 314 according to an embodiment of the present invention. The channel control unit 314 includes a delay detection unit 410, a delay calculation unit 420, a delay equalization unit 430, a delay determination unit 440 and a multiplexer 450. The delay detection unit 410 receives all feedback signals ACK1 to ACKn (assuming there are n memory control units 150, where n is a positive integer greater than 1, and each feedback signal is a 1-bit signal), and computes the n feedback signals to generate n delay signals D1 to Dn (similarly 1-bit signals). The delay calculation unit 420 calculates the n delay signals by a counter to obtain calculation results DC1 to DCn (x-bit signals, where x is a positive integer, indicating that a maximum count of the counter is $2^x-1$, and x is adjusted according to the quantity and relative delay conditions of the memory control units 150) respectively corresponding to the memory control units 150. Since the multi-channel memory self-testing device 310 only needs to learn the relative delay relationship of the feedback signals, the delay equalization unit 430 then adjusts all of the calculation results according to the smallest calculation result. That is, the smallest calculation result is subtracted from all of the calculation results, such that the smallest calculation result becomes 0, and the remaining calculation results become delay numbers relative to the smallest calculation result. The delay equalization unit 430 further updates the calculation results in the delay calculation unit 420 according to the adjusted calculation results. For example, the delay equalization unit 430 directly utilizes the returned adjusted calculation results (DC'x, $1 \leq x \leq n$) as the calculation results in the delay calculation unit 420. Alternatively, the delay equalization unit 430 controls all of the calculation results in the delay calculation unit 420 to be subtracted by a predetermined value. Thus, the count of the counter in the delay calculation unit 420 can be constantly adjusted, and so a counter having a smaller bit count can be adopted for reduced costs. According to a smallest value of the equalized calculation results DC'1 to DC'n (similarly x-bit signals), the delay determination unit 440 generates a leading indication signal F (a y-bit signal, where y is a positive integer satisfying an equation $2^y \geq n$, and is a smallest positive integer satisfying the above equation to reduce costs in a preferred embodiment), which indicates the serial number of the leading feedback signal among the n feedback signals. The multiplexer 450 selects one from the n feedback signals according to the leading indication signal F and outputs the selected signal as the leading feedback signal AD (1-bit signal).

Figure 5:
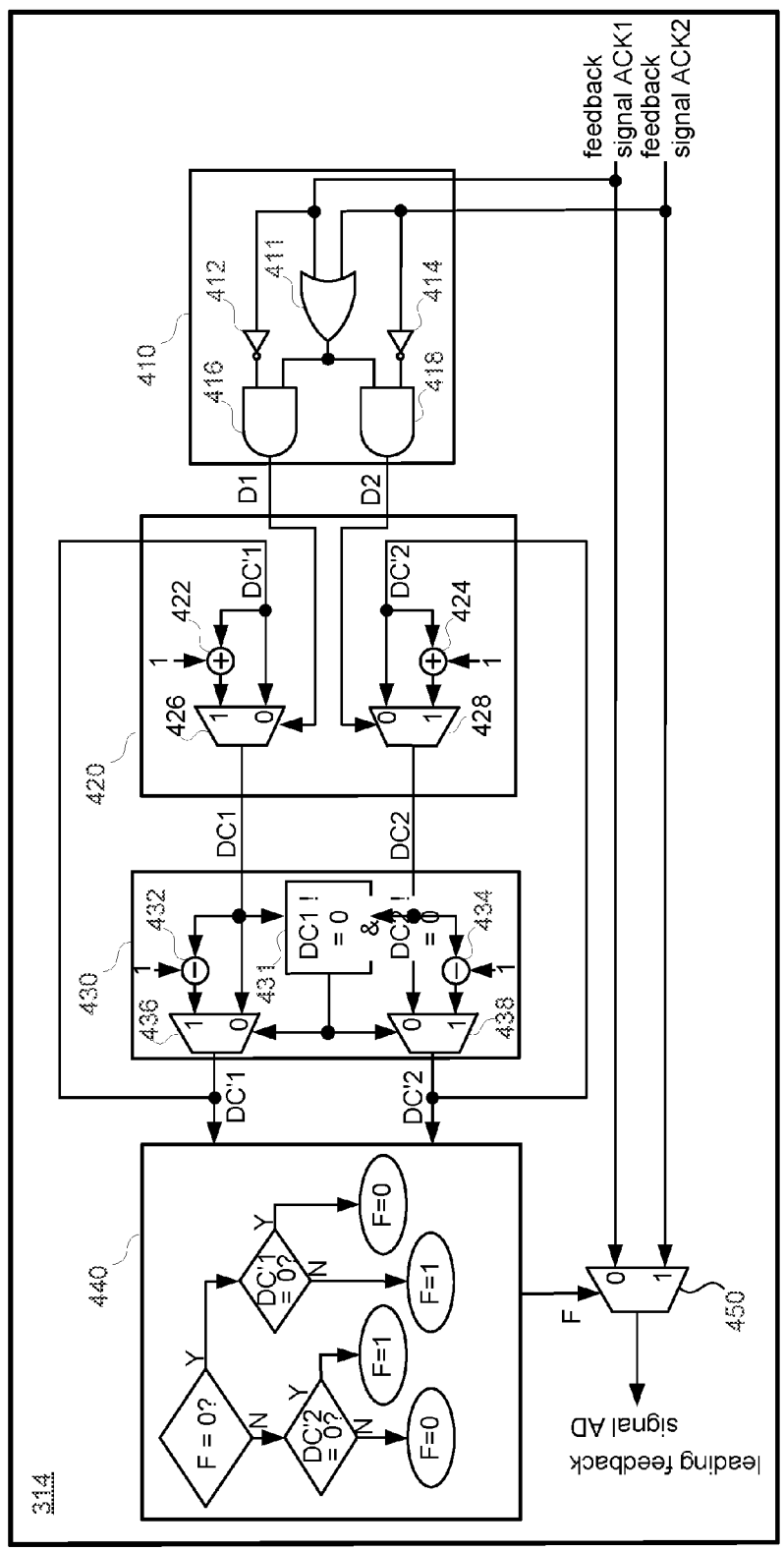
FIG. 5 depicts exemplary detailed functions of a block diagram a channel control unit 314 according to an embodiment of the present invention.
Figure 6:
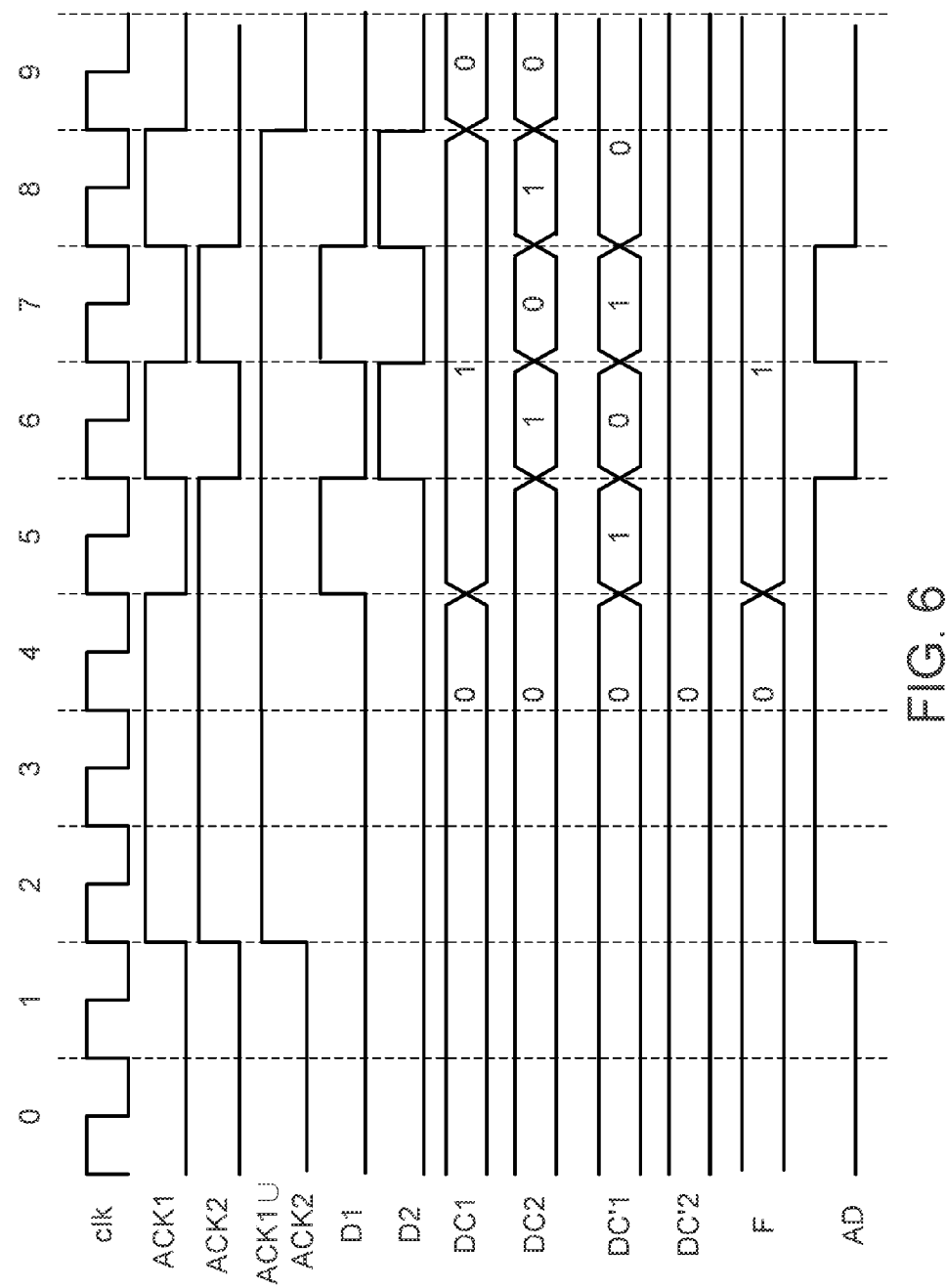
FIG. 6 is a timing diagram corresponding to the circuit in FIG. 5.

FIG. 5 depicts detailed functions of a block diagram of the channel control unit 314 according to an embodiment of the present invention. FIG. 6 shows an exemplary timing diagram corresponding to the circuit in FIG. 5. For simplicity, the circuit system 300 in FIG. 5 and FIG. 6 includes only two memory control units 150 as an example. The channel control unit 314 operates according to a clock clk, and the $0^{th}$ to the $9^{th}$ clock periods are shown in FIG. 6. The delay detection unit 410 includes an OR gate 411, NOT gates 412 and 414, and AND gates 416 and 418. A feedback signal ACK1 and a feedback signal ACK2 pass through the OR gate 411 to generate a feedback signal union ACK1∪ACK2, which then intersects an inverse of the feedback signal ACK1 and an inverse of the feedback signal ACK2 to generate delay signals D1 and D2, respectively. The delay calculation unit 420 changes the counts (i.e., the calculation results DC1 and DC2) respectively corresponding to the feedback signal ACK1 and the feedback signal ACK2 according to the states of the delay signals D1 and D2. For example, in this embodiment, when D1=D2=0, the calculation results D1 and D2 are kept unchanged (e.g., as shown by the $0^{th}$ to the $4^{th}$ clock periods); when D1=1 and D2=0, the calculation result DC1 is added by 1 but the calculation result DC2 is kept unchanged (e.g., as shown by the $5^{th}$ clock period); when D1=0 and D2=1, the calculation result DC1 is kept unchanged but the calculation result DC2 is added by 1 (e.g., as shown by the $6^{th}$ clock period). As such, the delay calculation unit 420 constantly changes the calculation results DC1 and DC2 according to the delay signals D1 and D2. A decision unit 431 in the delay equalization unit 430 determines whether to adjust the calculation results DC1 and DC2 according to the calculation results DC1 and DC2. In this embodiment, the calculation results DC1 and DC2 pass through subtractors 432 and 434 and are subtracted by 1, and are then inputted with the original values into multiplexers 436 and 438, respectively. When DC1≠0 and DC2≠0 (as shown by the $6^{th}$ clock period), the decision unit 431 controls the multiplexers 436 and 438 to output the calculation results that have been subtracted by 1. Thus, the value of the calculation result DC1 in the $7^{th}$ clock period is a sum (still 1) of the value (0 at this point) of the equalized calculation result DC'1 in the $6^{th}$ clock period added by 1, and the value of the calculation result DC2 in the $7^{th}$ clock period is kept as the value of the calculation result DC'2 in the $6^{th}$ clock period. The purpose of the above is to cause the smaller calculation result as 0 and to maintain the difference between the calculation results DC1 and DC2 to achieve an equalization effect. The delay equalization unit 430 then outputs the equalized calculation results DC'1 and DC'2. As shown, the delay calculation unit 420 receives the equalized calculation result DC'1 (DC'2), and determines whether to adjust the equalized calculation result DC'1 (DC'2) by an adder 422 (424) and a multiplexer 426 (428) to provide new calculation results DC1 and DC2. The delay determination unit 440 generates the leading indication signal F according to the equalized calculation results DC'1 and DC'2. In a preferred embodiment, the leading indication signal F is first set to a predetermined value (0 or 1, with 0 corresponding to the feedback signal ACK1, and 1 corresponding to the feedback signal ACK2). The delay determination unit 440 then determines whether the leading indication signal F is 0. If so, it is determined whether the equalized calculation result DC'1 is 0; if not, it is determined whether the equalized calculation result DC'2 is 0. That is to say, according to the smallest equalized calculation result (expectedly 0 after the equalization), the delay determination unit 440 outputs the corresponding leading indication signal F, which instructs a multiplexer 450 to select the feedback signal (the feedback signal ACK2 in this example) corresponding to the smallest equalized calculation result as the leading feedback signal AD.

It should be noted that, without considering the cost of the counter used in the delay calculation unit 420, the delay equalization unit 430 of the present invention may be omitted. At this point, the delay determination unit 440 outputs the corresponding leading indication signal F according to the smallest calculation result (non-equalized, and not necessarily 0).

Figure 7:
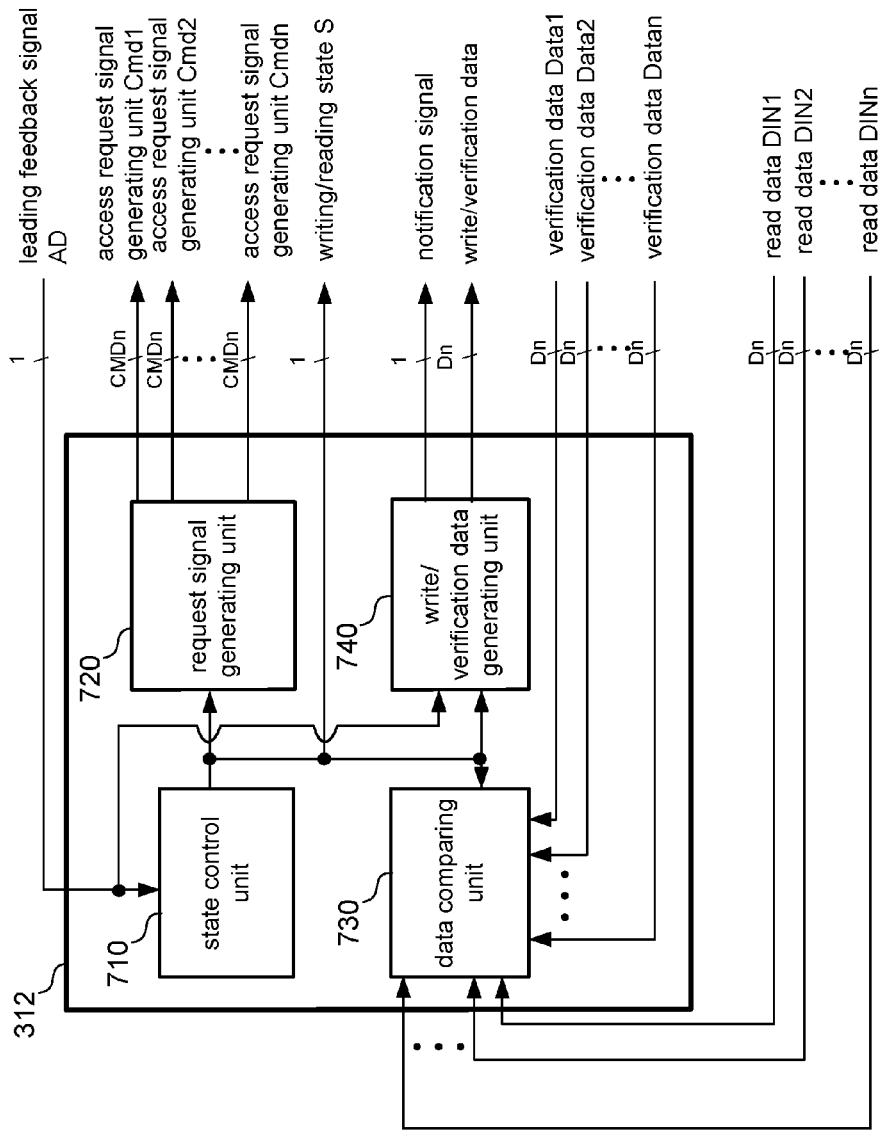
FIG. 7 is a block diagram of a test control unit 312 according to an embodiment of the present invention.

FIG. 7 shows a block diagram of the test control unit 312 according to an embodiment of the present invention. The test control unit 312 includes a state control unit 710, a request signal generating unit 720, a data comparing unit 730, and a write/verification data generating unit 740. The state control unit 710 mainly controls a current test state, i.e., write data into the memory components 160 (a writing state) or read data from the memory components 160 (a reading state). At the beginning of the test, a writing/reading state S of the state control unit 710 is a writing state (1-bit signal, indicating the writing state by a high level, for example), and the request signal generating unit 720 issues an access request signal Cmd (a writing request at this point) according to the writing/reading state S. According to the leading feedback signal AD and the writing/reading state S, the write/verification data generating unit 740 outputs a notification signal FW and write/verification data Data to the data control unit 316. The data control unit 316 writes the write/verification data Data into a storage medium according to the notification signal FW, and the write/verification data Data can then be accessed when the memory control unit 150 is to write data into the memory component 160. The request signal generating unit 720 and the write/verification data generating unit 740 repeat the above steps until the data that has been written reaches a predetermined number of sets. More specifically, when the state control unit 710 has received a predetermined number of sets of the leading feedback signal AD and the data control unit 316 has verified that all the write/verification data is completely read by all the memory control units 150, the state control unit 710 changes the signal of the writing/reading state S to a reading state (e.g., representing a reading state by a low level), and the request signal generating unit 720 and the write/verification data generating unit 740 then stop issuing the write request and stop generating the write/verification data, respectively.

In the reading state, the state control unit 710 controls the request signal generating unit 720 to generate the access request signal Cmd (a reading request at this point), and the write/verification data generating unit 740 outputs the notification signal FW and the write/verification data Data to the data control unit 316 according to the leading feedback signal AD and the writing/reading state S, and the data control unit 316 writes the write/verification data Data into the storage medium according to the notification signal FW. The memory control units 150 then transmit read signals and read data DIN. The data comparing unit 730 receives the read data DIN, and compares the read data DIN with the write/verification data Data received from the data control unit 316. Further, the data comparing unit 730 simultaneously compares n sets of read data DIN with n sets of write/verification data Data. Due to the signal delay among the memory control units 150, the data control unit 316 needs to have a predetermined mechanism for ensuring that the data comparing unit 730 compares the write/verification data Data with the corresponding read data DIN. Similarly, the request signal generating unit 720, the write/verification data generating unit 740 and the data comparing unit 730 repeat the above steps, until the data that has been read reaches a predetermined number of sets and the data control unit 316 has verified that all the verification data has been completely read by the data comparing unit 730. At this point, the reading state is complete.

Figure 8:
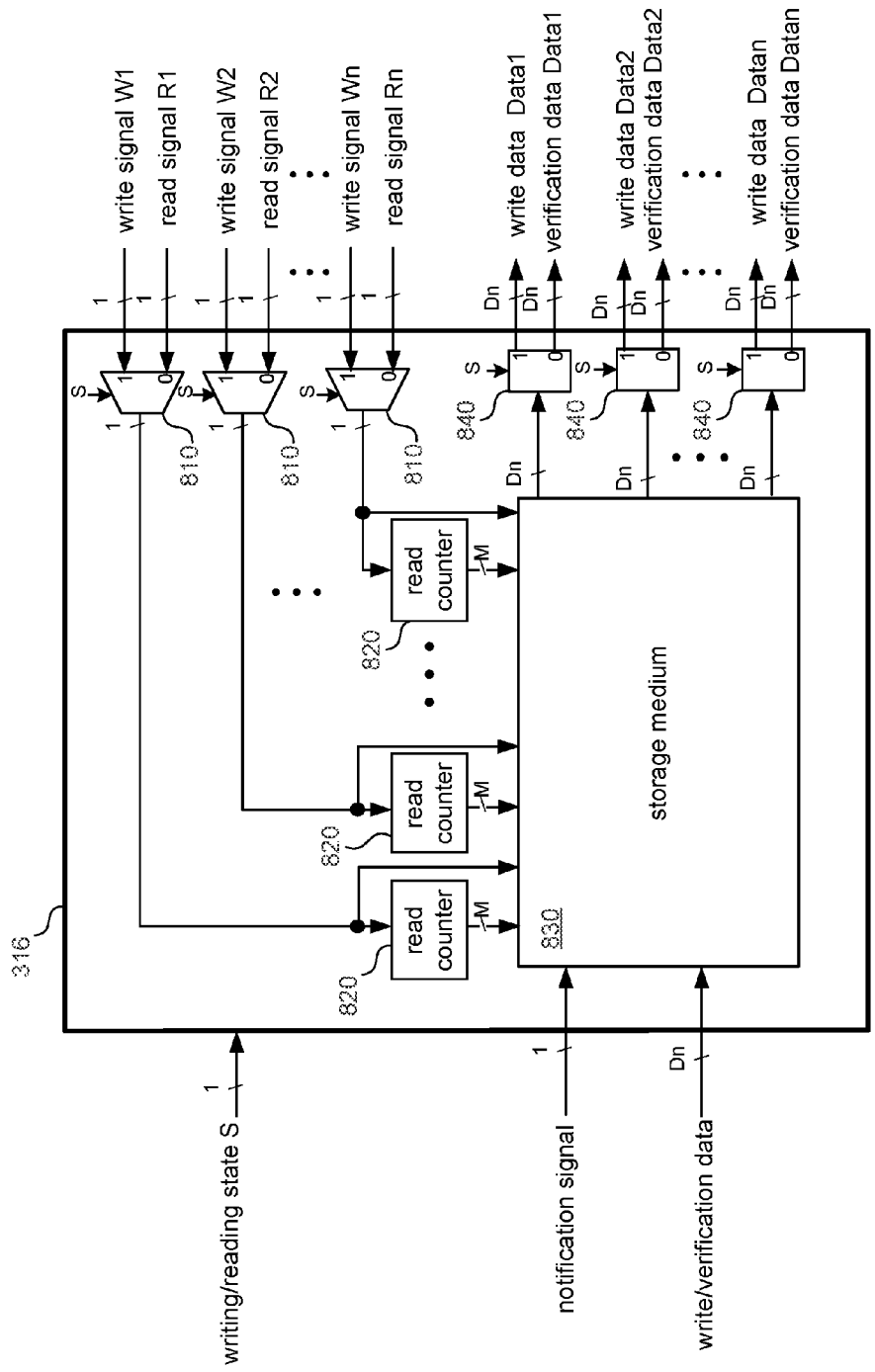
FIG. 8 is a block diagram of a data control unit 316 according to an embodiment of the present invention.

Circuit details and operations of the data control unit 316 are described below. FIG. 8 shows a block diagram of the data control unit 316 according to an embodiment of the present invention. The data control unit 316 includes a plurality of multiplexers 810, a plurality of read counters 820, a storage medium 830, and a plurality of demultiplexers 840. The writing/reading state S sent by the state control unit 710 of the test control unit 312 controls the multiplexers 810 to select a write signal W or a read signal R, and controls the demultiplexers 840 to output the write/verification data Data stored in the storage medium as write data (outputted to the memory control units 150) or as verification data (outputted to the data comparing unit 730 of the test control unit 312). When the multi-channel memory self-testing device 310 is in a data writing state, the write/verification data Data generated by the write/verification data generating unit 740 is stored to the storage medium 830 according to the notification signal FW, and the data control unit 316 selects and outputs the appropriate write data from the storage medium 830 according to the write signals W. More specifically, after entering the data control unit 316, the write signal W is directly transmitted to the storage medium 830 to instruct the progressing of the read operation, and also passes through the read counters 820 to count the data writing state of each of the memory control units 150. For example, at the beginning of the test, the value of each of the read counters 820 is 0, and the data control unit 316 outputs data from an address 0 of the storage medium (as an example for illustration but not a limitation to the present invention) corresponding to each write signal W. After a period of time, due to the signal delay, the values of the read counters 820 become different, and the data read from the storage medium is also changed. After the data is read out, the multiplexers 840 outputs write data in response to the current writing/reading state S. Similarly, when the multi-channel memory self-testing device 310 is in a reading state, the storage medium 830 stores the write/verification data Data according to the notification signal FW, and the corresponding write/verification data Data may be read from the storage medium 830 according to the read signal R selected by the multiplexer 810 and the value of the read counter 820. After the data is read out, the multiplexers 840 output the verification data in response to the current reading/writing state S. It should be note that, the size of the storage medium 830 is designed according to the quantity of the memory control units 150 and the corresponding signal delay conditions. As the quantity of the memory control units 150 gets smaller and the delay conditions among the signals gets more moderate, the size of the storage medium 830 needed can be smaller, or else a larger storage medium 830 is required to prevent data errors. In one preferred embodiment, the storage medium 830 may be one of a one-to-multiple first-in-first-out (FIFO), a static random access memory (SRAM), and a register.

Figure 9:
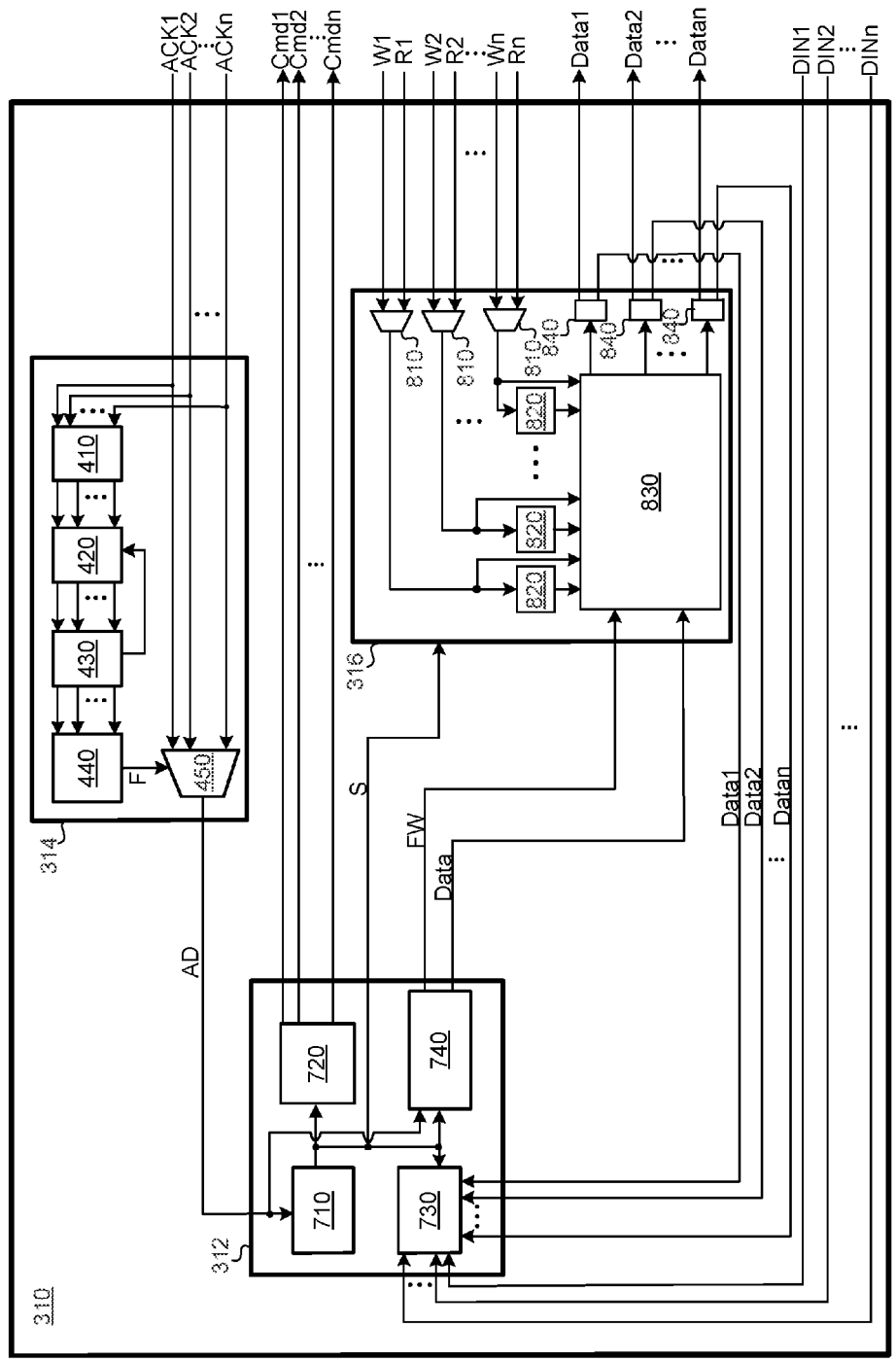
FIG. 9 is a detailed circuit diagram of a multi-channel self-testing device 310 according to an embodiment of the present invention.

FIG. 9 shows a detailed circuit diagram of the multi-channel memory self-testing device 310 according to an embodiment of the present invention. Connections among the test control unit 312, the channel control unit 314 and the data control unit 316 can be clearly observed from the diagram. Further, which signals are input/output signals of the multi-channel memory self-testing device 10 and which signals are internal communication signals are also clearly defined.

Figure 10:
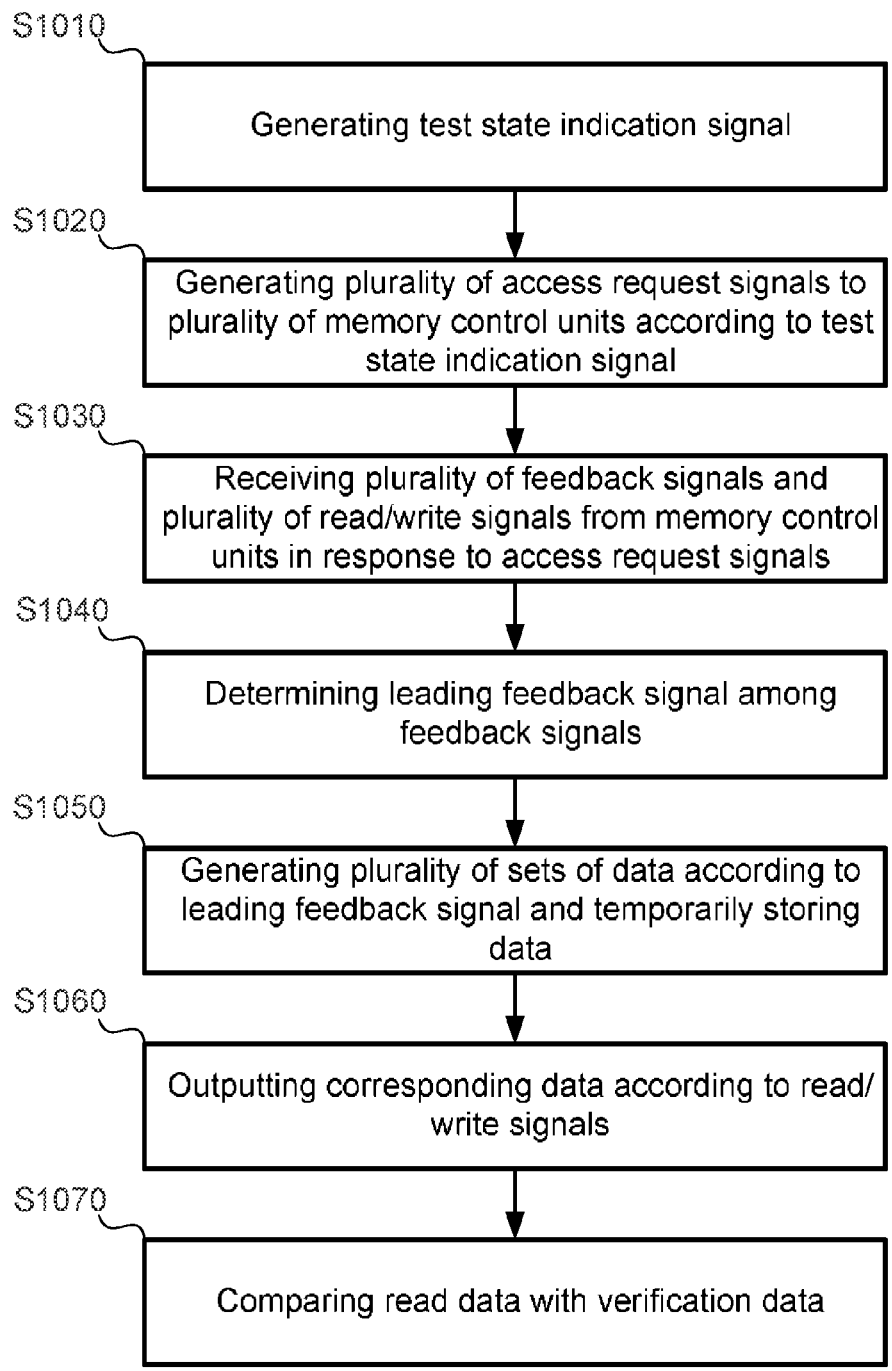
FIG. 10 is a flowchart of a memory self-testing method according to an embodiment of the present invention.

FIG. 10 shows a flowchart of a memory self-testing method according to an embodiment of the present invention. In addition to the foregoing memory self-testing device, the present invention correspondingly discloses a memory self-testing method capable of simultaneously testing a plurality of memory control units and corresponding channels. The method may be performed by the foregoing memory self-testing device 310 or by an equivalent device. As shown in FIG. 10, the memory self-testing method according to an embodiment of the present invention includes following steps.

In step S1010, a test state indication signal is generated. The test on the memory control units includes a writing test and a reading test. In this step, the test state indication signal indicates writing state in the writing test, and indicates reading state in the reading state.

In step S1020, a plurality of access request signals are generated and provided to the memory control units according to the test state indication signal. For the writing state, writing request signals are generated and provided to the memory control units. For the reading state, reading request signals are generated and provided to the memory control units.

In step S1030, a plurality of feedback signals and a plurality of read/write signals in response to the access request signals are received from the memory control units. Feedback signals and write signals are returned in response if the memory control units receive writing request signals, and feedback signals and read signals are returned in response if the memory control units receive reading request signals.

In step S1040, a leading feedback signal among the feedback signals is determined. Because of different operation clocks and phases of the memory control units, the feedback signals generated may also lead or fall behind temporally. Thus, in this step, the temporal orders of the feedback signals are determined to generate the leading feedback signal.

In step S1050, a plurality of sets of data is generated according to the leading feedback signal, and the data is temporarily stored. Due to different time points at which the memory control units respond by the feedback signals, the write data written into the memory control units at the same time point or the read data received from the memory control units at the same time may not be the same. Thus, appropriate write data or verification data is generated according to the leading feedback signal. In this step, for the writing test, the write data to be written into the memory components is generated by the memory control units and temporarily stored; for the reading test, verification data is generated and temporarily stored. The verification data is later to be compared with the read data received from the memory control units.

In step S1060, corresponding data is outputted according to the read/write signals. In the writing test, the write data temporarily stored in the previous step is outputted according to the write signals of the memory control units. In the reading test, the verification data temporarily stored in the previous step is outputted according to the read signals of the memory control units. As the read/write signals of some memory control units may be faster and some may be slower, this step further includes calculating the read/write signals of the memory control units, and outputting the corresponding write data or verification data according to calculation values.

In step S1070, the read data is compared with the verification data. The write data generated in step S1050 is associated with the verification data. Thus, if the read data last returned from the one memory control unit and the verification data is the same, or has a predetermined relationship, it means that the memory control unit passes the writing or reading test, and the memory control unit and the corresponding channel are normal. Else, it is determined that the memory control unit and/or the corresponding channel are/is abnormal.

Figure 11:
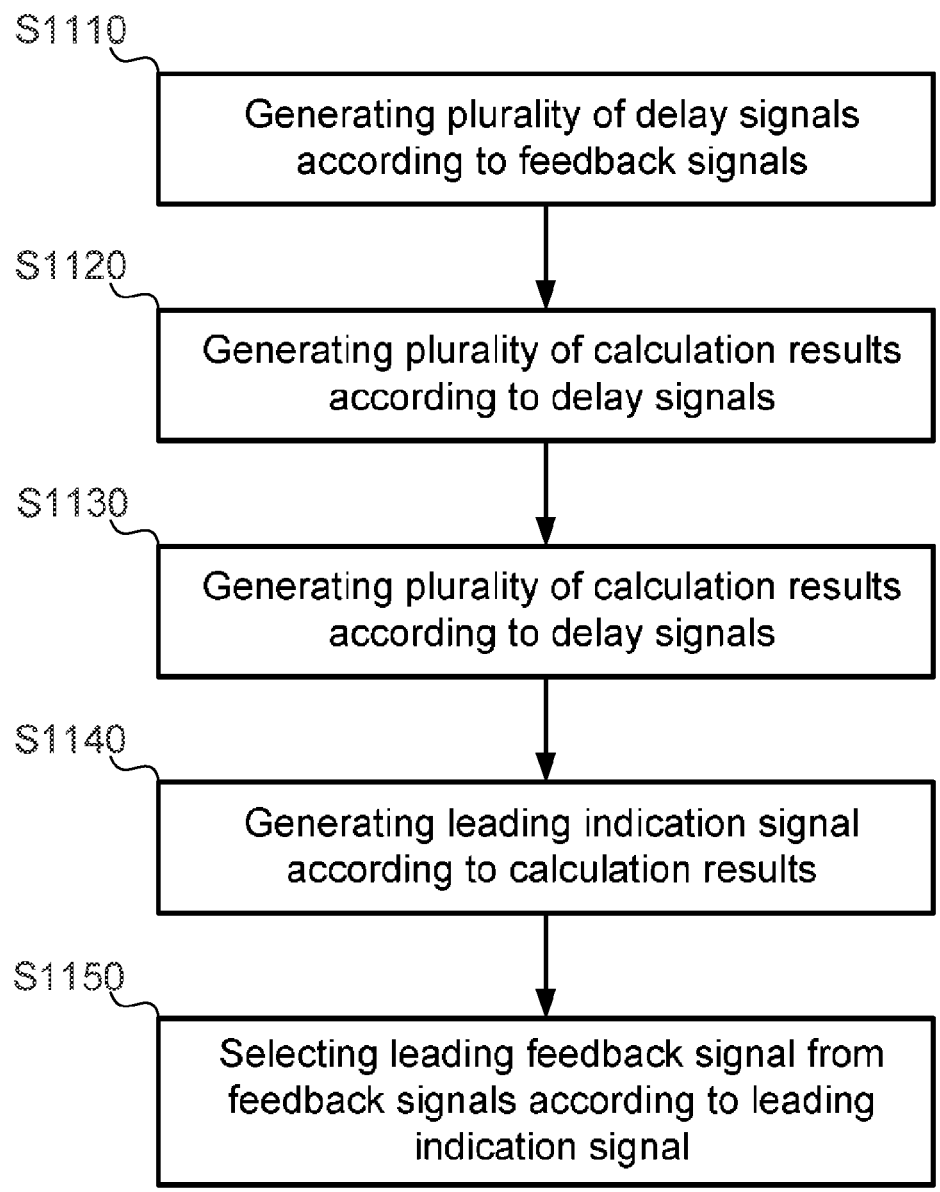
FIG. 11 is a flowchart of a memory self-testing method determining a leading feedback signal among feedback signals according to an embodiment of the present invention.

FIG. 11 shows a flowchart of a determining a leading feedback signal among feedback signals in a memory self-testing method according to an embodiment of the present invention. The above step S1040 may be further divided into steps below.

In step S1110, a plurality of delay signals are generated according to the feedback signals. The delay signals represent a relationship of temporally leading and falling behind of the feedback signals.

In step S1120, a plurality of calculation results are generated according to the delay signals. The calculation results represent the number of times of the memory control units falling behind. A smaller value of one calculation result indicates that one memory control unit falls behind for a less number of times, or else a larger value indicates that the memory control unit falls behind for a more number of times.

In step S1130, the calculation results are adjusted to reduce the bit count that the calculation results need. The calculation results in the previous step are usually generated by a digital counter. The bit count of the counter increases as the values of the calculation results get larger, leading a higher cost of the counter. To reduce the cost of the counter, in the present invention, relatively leading and falling behind feedback signals are identified. Thus, in this step, a smallest value of the calculation results is identified, and the smallest value is subtracted from all the calculation results to reduce the values of the calculation results. However, if the cost is not a concern, this step may be omitted.

In step S1140, a leading indication signal is generated according to the calculation results. The smallest calculation result corresponds to the fastest feedback signal. Thus, the leading indication signal may be generated according to the smallest calculation result. The leading indication signal indicates the earliest feedback signal responded.

In step S1150, a leading feedback signal is selected from the feedback signals according to the leading indication signal. The leading feedback signal may then be obtained according to the leading indication signal, i.e., the leading feedback signal may be identified from the feedback signals.

In conclusion, the memory self-testing method of the present invention is capable of simultaneously testing a plurality of memory control units and the corresponding channels. One person skilled in the art can understand details and possible implementation variations of the method in FIG. 10 and FIG. 11 according to the disclosure of the devices in FIG. 3 to FIG. 9. In possible implementation, one skilled person in the art would selectively implement part or all technical features of any embodiment of the application or selectively combine part or all technical features of the embodiments of the application based on the disclosure of the present invention to enhance the implementation flexibility of the present invention.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory self-testing device, for testing a plurality of memory control units, comprising:
    a test control unit, coupled to the memory control units, generating a plurality of access request signals and a plurality of sets of data;
    a channel control unit, coupled to the test control unit and the memory control units, determining a leading feedback signal among a plurality of feedback signals, the feedback signals being generated by the memory control units in response to the access request signals; and
    a data control unit, coupled to the test control unit and the memory control units, storing the sets of data, and transmitting the sets of data to the memory control units according a plurality of read/write signals, the read/write signals being generated by the memory control units in response to the access request signals;
    wherein, the test control unit generates the sets of data according to the leading feedback signal.

2. The memory self-testing device according to claim 1, wherein the test control unit comprises:
    a state control unit, generating a test state indication signal according to the leading feedback signal;
    a request signal generating unit, coupled to the state control unit, generating the access request signals according to the test state indication signal; and
    a data generating unit, coupled to the state control unit, generating the sets of data according to the test state indication signal.

3. The memory self-testing device according to claim 2, wherein when the memory self-testing device performs a writing test, the sets of data are sets of write data, the read/write signals are write signals, and the data control unit outputs the sets of write data to the memory control units according to the write signals.

4. The memory self-testing device according to claim 2, wherein the test control unit further comprises:
    a data comparing unit, coupled to the state control unit, the data generating unit and the memory control units, comparing the sets of data with a plurality of sets of read data, the sets of read data being generated by the memory control units in response to the access request signals.

5. The memory self-testing device according to claim 4, wherein when the memory self-testing device performs a reading test, the sets of data are sets of verification data, the read/write signals are read signals, and the data control unit outputs the sets of verification data to the data comparing unit according to the read signals.

6. The memory self-testing device according to claim 1, wherein the channel control unit comprises:
   a delay detection unit, coupled to the memory control units, generating a plurality of delay signals according to the feedback signals;
   a delay calculation unit, coupled to the delay detection unit, generating a plurality of calculation results according to the delay signals;
   a delay determination unit, coupled to the delay calculation unit, generating a leading indication signal according to the calculation results; and
   a selecting unit, coupled to the delay determination unit and the memory control units, selecting the leading feedback signal from the feedback signals according to the leading indication signal.

7. The memory self-testing device according to claim 6, wherein the channel control unit further comprises:
   a delay equalization unit, coupled to the delay calculation unit, adjusting the calculation results to reduce a bit count that the calculation results need.

8. The memory self-testing device according to claim 1, wherein the data control unit comprises:
   a storage medium, storing the sets of data; and
   a plurality of counters, coupled to the storage medium, generating a plurality of counts according to the read/write signals, the counts being associated with memory addresses for writing or reading the storage medium.

9. A memory self-testing method, for testing a plurality of memory control units, comprising:
   generating a plurality of access request signals to the memory control units;
   determining a leading feedback signal among a plurality of feedback signals, the feedback signals being generated by the memory control units in response to the access request signals;
   generating a plurality of sets of data according to the leading feedback signal, and temporarily storing the sets of data; and
   transmitting the sets of data to the memory control units according a plurality of read/write signals, the read/write signals being generated by the memory control units in response to the access request signals.

10. The memory self-testing method according to claim 9, wherein the step of generating the access request signals comprises:
    generating a test state indication signal; and
    generating the access request signals according to the test state indication signal.

11. The memory self-testing method according to claim 9, wherein when the method performs a writing test, the sets of data are sets of write data, the read/write signals are write signals, and the step of transmitting the sets of data according to the read/write signals transmits the sets of write data to the memory control units according to the write signals.

12. The memory self-testing method according to claim 9, wherein the sets of data comprises a plurality of sets of verification data, the method further comprising:
    comparing the sets of verification data with a plurality of sets of read data, the sets of read data being generated by the memory control units in response to the access request signals.

13. The memory self-testing method according to claim 9, wherein the step of determining the leading feedback signal among the feedback signals comprises:
    generating a plurality of delay signals according to the feedback signals;
    generating a plurality of calculation results according to the delay signals;
    generating a leading indication signal according to the calculation results; and
    selecting the leading feedback signal from the feedback signals according to the leading indication signal.

14. The memory self-testing method according to claim 13, wherein the step of determining the leading feedback signal among the feedback signals further comprises:
    adjusting the calculation results to reduce a bit count that the calculation results need.

15. A circuit system, comprising:
    a plurality of memory control units, controlling a plurality of memory components;
    a function module, coupled to the memory control units, accessing the memory components through the memory control units; and
    a memory self-testing device, coupled to the memory control units, simultaneously testing the memory control units,
    wherein the memory self-testing device comprises:
    a test control unit, coupled to the memory control units, generating a plurality of access request signals and a plurality of sets of data;
    a channel control unit, coupled to the test control unit and the memory control units, determining a leading feedback signal among a plurality of feedback signals, the feedback signals being generated by the memory control units in response to the access request signals; and
    a data control unit, coupled to the test control unit and the memory control units, storing the sets of data, and transmitting the sets of data to the memory control units according a plurality of read/write signals, the read/write signals being generated by the memory control units in response to the access request signals;
    wherein, the test control unit generates the sets of data according to the leading feedback signal.

16. The circuit system according to claim 15, wherein the test control unit comprises:
    a state control unit, generating a test state indication signal according to the leading feedback signal;
    a request signal generating unit, coupled to the state control unit, generating the access request signals according to the test state indication signal; and
    a data generating unit, coupled to the state control unit, generating the sets of data according to the test state indication signal.

17. The circuit system according to claim 16, wherein the test control unit further comprises:
    a data comparing unit, coupled to the state control unit, the data generating unit and the memory control units, comparing the data with a plurality of sets of read data, the sets of read data being generated by the memory control units in response to the access request signals.

18. The circuit system according to claim 15, wherein the channel control unit comprises:
    a delay detection unit, coupled to the memory control units, generating a plurality of delay signals according to the feedback signals;
    a delay calculation unit, coupled to the delay detection unit, generating a plurality of calculation results according to the delay signals;
    a delay determination unit, coupled to the delay calculation unit, generating a leading indication signal according to the calculation results; and a selecting unit, coupled to the delay determination unit and the memory control units, selecting the leading feedback signal from the feedback signals according to the leading indication signal.

19. The circuit system according to claim 15, wherein the data control unit comprises:
a storage medium, storing the sets of data; and
a plurality of counters, coupled to the storage medium, generating a plurality of counts according to the read/write signals, the counts being associated with memory addresses for writing or reading the storage medium.

\* \* \* \* \*